(12) United States Patent
Ootani

(10) Patent No.: US 6,301,114 B1
(45) Date of Patent: Oct. 9, 2001

(54) MULTILAYERED ELECTRONIC PART AND ELECTRONIC CIRCUIT MODULE INCLUDING THEREIN THE MULTILAYERED ELECTRONIC PART

(75) Inventor: Mitsuaki Ootani, Tokyo (JP)

(73) Assignee: Taiyo Yuden Co.,Ltd., Tokyo (JP)

( * ) Notice: Subject to any disclaimer, the term of this patent is extended or adjusted under 35 U.S.C. 154(b) by 0 days.

(21) Appl. No.: 09/576,059

(22) Filed: May 20, 2000

(30) Foreign Application Priority Data

May 21, 1999 (JP) .................................................. 11-142000

(51) Int. Cl.⁷ ...................................................... H05K 7/20
(52) U.S. Cl. ........................ 361/704; 361/719; 361/715; 257/713
(58) Field of Search .................................... 361/704, 707, 361/709–711, 714–722, 760, 761, 792, 795; 257/700, 706, 707, 713, 774; 165/80.2, 185

(56) References Cited

U.S. PATENT DOCUMENTS

| 3,952,231 | * | 4/1976 | Davidson et al. | 361/717 |
| 5,158,912 | * | 10/1992 | Kellerman et al. | 438/126 |
| 5,475,264 | * | 12/1995 | Sudo et al. | 257/723 |
| 5,543,661 | * | 8/1996 | Sumida | 257/707 |
| 5,675,474 | * | 10/1997 | Nagase et al. | 361/704 |
| 5,717,249 | * | 2/1998 | Yoshikawa et al. | 257/728 |
| 5,814,883 | * | 9/1998 | Sawai et al. | 257/712 |
| 5,831,825 | * | 11/1998 | Fromont | 361/719 |
| 5,973,395 | * | 10/1999 | Suzuki et al. | 257/692 |

FOREIGN PATENT DOCUMENTS

360154632A * 8/1985 (JP) .

* cited by examiner

Primary Examiner—Leo P. Picard
Assistant Examiner—Boris L. Chervinsky
(74) Attorney, Agent, or Firm—Rosenman & Colin, LLP

(57) ABSTRACT

The present invention provides a multilayered electronic component (110) having improved thermolytic effect for an electronic circuit module (100), facilitating the realization of a miniaturization of the electronic circuit module (100). The multilayered electronic component (110) is provided with a first surface (111), a second opposite surface and side surfaces. A heat dissipation pattern (116) is formed in the multilayered electronic component (110) in a vicinity of the first surface (111) thereof on which a plurality of lands (114) is formed, in such a way that at least one land (114) is electrically connected to the heat dissipation pattern (116). A semiconductor chip (140) is mounted on the first surface (111) of the multilayered electronic component (110), thereby forming the electronic circuit module (100). Heat induced in the semiconductor chip (140) is emitted from the heat dissipation pattern (116), which will, in turn, make a thermolytic effect of the electronic circuit module (100) be improved.

19 Claims, 12 Drawing Sheets

MULTILAYERED ELECTRONIC PART AND ELECTRONIC CIRCUIT MODULE INCLUDING THEREIN THE MULTILAYERED ELECTRONIC PART

FIELD OF THE INVENTION

The present invention relates to a multilayered electronic part or component and an electronic circuit module including therein the multilayered electronic part or component.

DESCRIPTION OF THE PRIOR ART

A common electronic circuit module and a multilayered electronic component included therein have been disclosed in Japanese Laid-open Application No. 94-112090. This electronic circuit module is employed as one of function blocks such as a DC-DC converting block in such a way that a chip including an inherent electronic circuit which is formed with passive devices, e.g., resistor(s), and/or active devices, e.g., transistor(s) and IC(s), is integrated on the multilayered electronic component having a multilayered inductor and a multilayered capacitor. The multilayered electronic component has a first surface, a second opposite surface and side surfaces, wherein external electrodes are formed on the side surfaces and the chip is attached to the first surface, in such a way that when the electronic circuit module is mounted onto a circuit board, the second opposite surface of the multilayered electronic component will face the circuit board.

A method for manufacturing the multilayered electronic component begins with a process for forming internal electrode patterns made of a conductive paste on dielectric ceramic sheets. At the same time, another internal electrode patterns made of a conductive paste are formed on ferrite sheets after making through-holes on the ferrite sheets. Then, the dielectric ceramic sheets and the ferrite sheets are piled up to form multilayered stacks, respectively. Finally, the multilayered stacks are sintered to form the multilayered electronic components, e.g., a multilayered capacitor and a multilayered inductor.

Considering the above electronic circuit module in view of its thermal radiation, it is difficult to realize a miniaturization of the electronic circuit module. In the electronic circuit module having a common size, a thermolytic effect of the electronic circuit module is achieved by forming an additional radiation fin in the active device, e.g., transistor. Accordingly, if the electronic circuit module is miniaturized, it is difficult to satisfactorily getting rid of the heat induced in each components, e.g., transistor and so on. In other words, the formation of the additional radiation fin impedes the miniaturization of the electronic circuit module and, on the other hand, the miniaturization thereof without any additional thermal radiation component will result in the insufficient thermal radiation.

SUMMARY OF THE INVENTION

It is, therefore, a primary object of the invention to provide a multilayered electronic component with improved thermolytic effect.

It is another objection of the invention to provide an electronic circuit module with the multilayered electronic component having improved thermolytic effect, thereby facilitating the realization of the miniaturization of the electronic circuit module.

In accordance with one aspect of the present invention, there is provided with a multilayered electronic component having a first top surface, the multilayered electronic component comprising: a plurality of insulating sheets and a plurality of conducting patterns, wherein the insulating sheets and the conducting patterns are alternately piled up on top of each other; at least one land formed on the first top surface thereof, for connecting the multilayered electronic component to another electronic component; a heat dissipation pattern formed in the multilayered electronic component in a vicinity of the first top surface thereof; and at least one external electrode for connecting the multilayered electronic component to a circuit board, wherein the heat dissipation pattern is electrically connected to the land as well as the external electrode.

In accordance with another aspect of the present invention, there is provided with an electronic circuit module, the electronic circuit module comprising: a multilayered electronic component including a plurality of insulating sheets and a plurality of conducting patterns, at least one land formed on a first top surface thereof, a heat dissipation pattern formed in the multilayered electronic component in a vicinity of the first top surface thereof, and at least one external electrode for connecting the multilayered electronic component to a circuit board, wherein the insulating sheets and the conducting patterns are alternately piled up on top of each other and the heat dissipation pattern is electrically connected to the land as well as the external electrode; and an exothermic electronic component mounted on the multilayered electronic component, wherein the exothermic electronic component is connected to the multilayered electronic component through the land.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Detailed description of preferred embodiments of the present invention will be presented with reference to the drawings hereinafter.

THE FIRST EMBODIMENT

Following description with reference to FIGS. 1 to 4 is concerned with the first embodiment of the present invention. FIGS. 1 to 4 show a fragmentary perspective view of an electronic circuit module having a partially sectioned multilayered electronic component, a cross sectional view of the electronic circuit module, a fragmentary perspective view of the multilayered electronic component, and a circuit diagram depicting an exemplary electric circuit included in the electronic circuit module, respectively.

Figure 1:
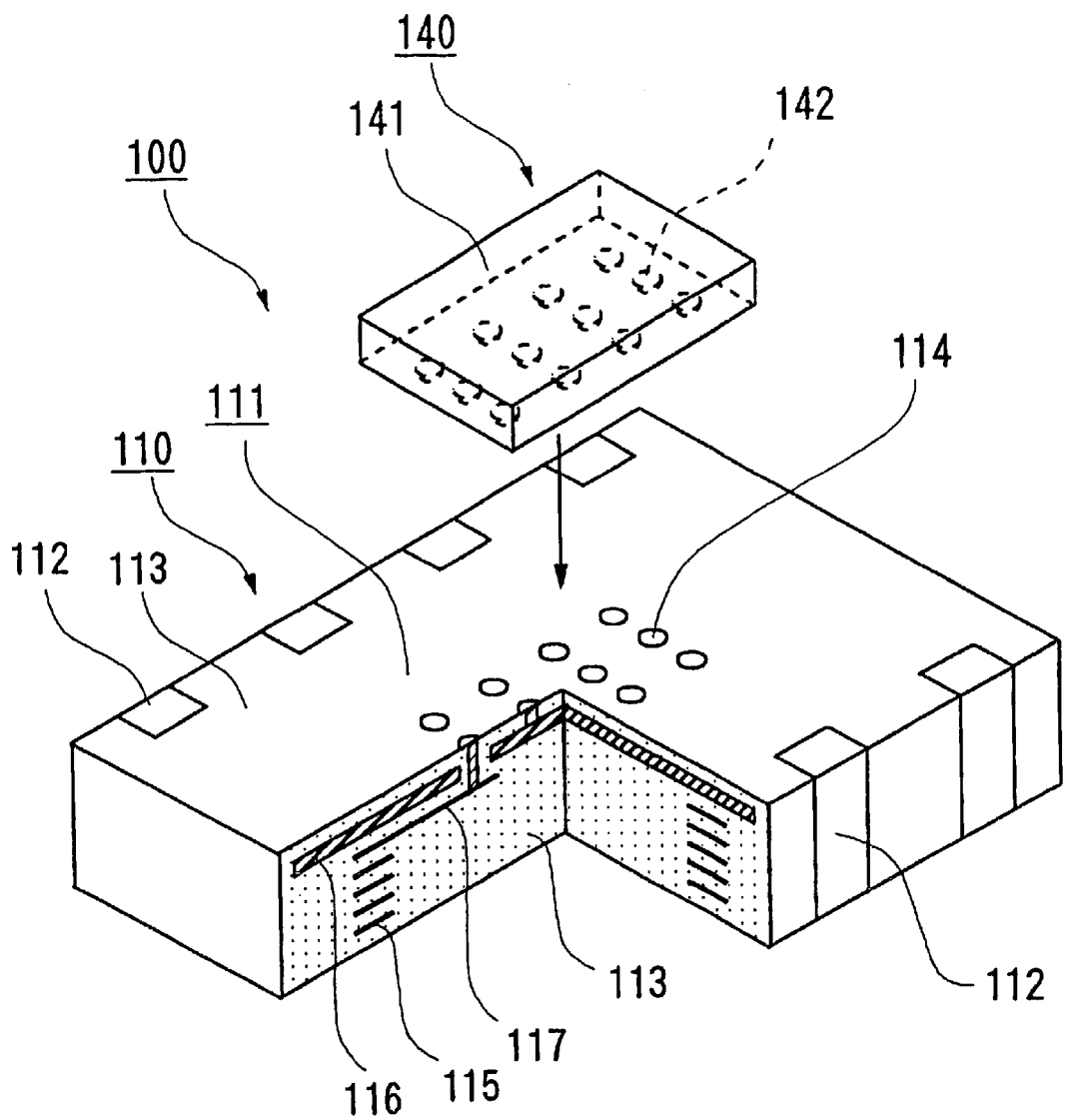
FIG. 1 shows a fragmentary perspective view of an electronic circuit module in accordance with the first embodiment of the present invention, wherein a multilayered electronic component is partially sectioned.
Figure 2:
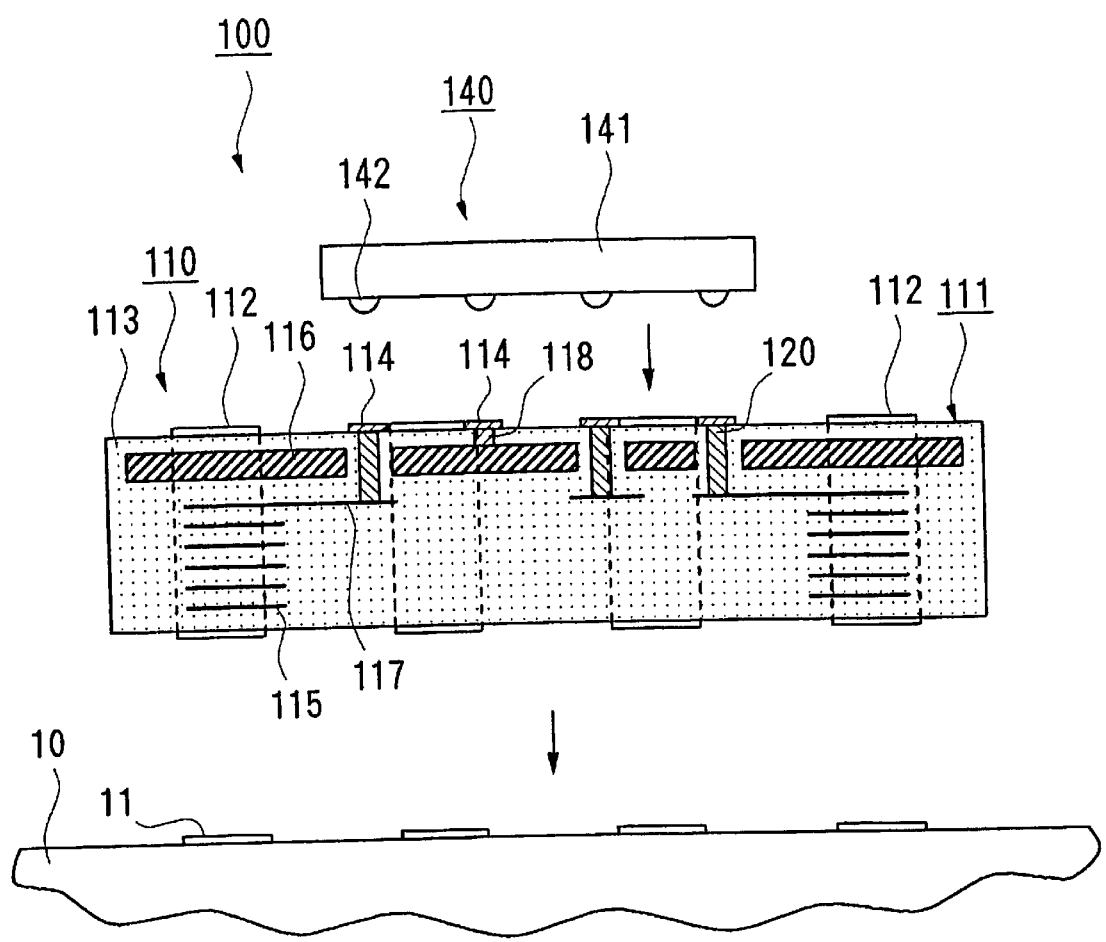
FIGS. 2 provides a cross sectional view of the electronic circuit module shown in FIG. 1.

As shown in FIG. 1, an electronic circuit module (100) is provided with a multilayered electronic component (110) having an inductor formed therein and a semiconductor chip (140). The multilayered electronic component (110) is provided with a first surface (111), a second opposite surface and side surfaces, wherein the semiconductor chip (140) is mounted on the first surface (111) and a plurality of external electrodes (112) are formed on the side surfaces. As shown in FIG. 2, the electronic circuit module (100) is formed on a circuit board (10) in such a way that the second opposite surface of the multilayered electronic component (110) faces one surface of the circuit board (10) and the external electrodes (112) of the multilayered electronic component (110) are electrically connected to electric circuit patterns (11) of the circuit board (10).

The multilayered electronic component (110) comprises a sintered magnetic element (113) having an orthorhombic shape, the external electrodes (112) formed on the side surfaces thereof and shaped like a band, and a plurality of lands located in the middle of the first surface (111) and functioning as terminal electrodes. Each of the external electrodes (112) extends from the side surface to peripheral portions of both the first (111) and the second opposite surface.

Figure 3:
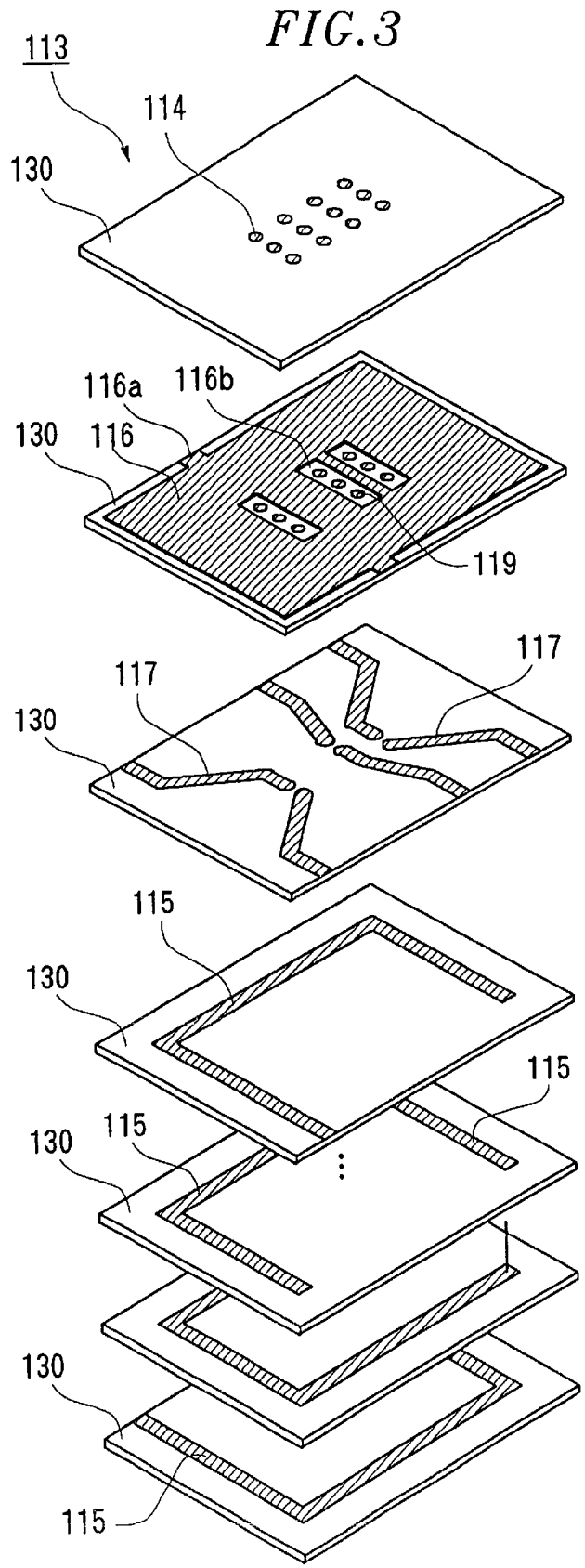
FIG. 3 represents a fragmentary perspective view of the multilayered electronic component shown in FIG. 1.

The sintered magnetic element (113) is made of a material having a high permeability, e.g., ferrite. Examples are a Ni—Zn—Cu ferrite, a Ni—Zn ferrite and a Cu—Zn ferrite. The sintered magnetic element (113) is formed by piling a plurality of magnetic green sheets (130) up, wherein each of the magnetic green sheets (130) has one of predetermined conductive patterns, as shown in FIG. 3. In detail, each of the magnetic green sheets includes one pattern selectively chosen from internal electrode patterns (115) for forming a coil, connection patterns (117), a heat dissipation pattern (116) and lands (114).

Each of the internal electrode patterns (115) is shaped like a horseshoe and pivots on an axis perpendicular to the first surface (111) so as to form a spiral. Each of the internal electrode patterns (115) formed on the magnetic green sheet (113) is connected to another neighboring internal electrode pattern (115) through a via-hole (not shown), in such a way that a wholly connected internal electrode pattern becomes a coil. Both ends of the wholly connected internal electrode pattern (115), that is, an inlet and an outlet of the coil, are exposed to the side surfaces of the multilayered electronic component (110) and are positioned so as to overlap with the external electrodes (112). The internal electrode patterns (115) are made from sintering a conductive paste, e.g., Ag-composite.

The heat dissipation pattern (116) is parallel to the first surface (111) and is made of a conductive paste having an efficient thermal conductivity. In this embodiment, the heat dissipation pattern (116) is made from sintering the conductive paste, e.g., Ag-composite, and is thicker than one internal electrode pattern (115) in order to improve the thermal conductivity thereof.

The heat dissipation pattern (116) is connected to the semiconductor chip (140) through the lands (114) and via-holes (118), as shown in FIG. 2, in such a way that heat induced in the semiconductor chip (140) is efficiently transferred to the heat dissipation pattern (116). As shown in FIG. 3, the heat dissipation pattern (116) is shaped like a rectangle having a smaller size than the first surface (111). The heat dissipation pattern (116) includes portions (116a) extended to the side surface of the sintered magnetic element (113) so as to be electrically connected to a ground through the external electrodes (112). The heat transferred from the semiconductor chip (140) to the heat dissipation pattern (116) is transferred to the circuit board (10) through the extended portions (116a) of the heat dissipation pattern (116) and the external electrodes (112) to be eventually emitted therefrom.

The heat dissipation pattern (116) includes a number of empty portions (116b) formed around the middle thereof. Each of the empty portions (116b) has intermediate lands (119) for electrically connecting the lands (114) to the connection patterns (117). The intermediate lands (119) are electrically disconnected from the heat dissipation pattern (116).

In order to efficiently transfer the heat from the semiconductor chip (140) to the heat dissipation pattern (116), it is desirable that a distance between the heat dissipation pattern (116) and the first surface (111) is short. To be specific, it is desirable for the distance to be shorter than the thickness of the heat dissipation pattern (116). In this embodiment, one magnetic green sheet (130) intervenes between the heat, dissipation pattern (116) and the first surface (111).

The connection patterns (117) are interposed between the heat dissipation pattern (116) and the internal electrode pattern (115). One end of each of the connection patterns (117) is electrically connected to one of the lands (114) through a via-hole (120) and the intermediate land (119). The other end of each of the connection patterns (117) extends to the side surface of the multilayered electronic component (110) so as to be connected to one of the external electrodes (112). Accordingly, the semiconductor chip (140) is electrically connected to the external electrode (112) as well as the internal electrode pattern (115).

As shown in FIGS. 1 and 2, the semiconductor chip (140) includes a chip body (141) and a plurality of connection balls (142), wherein one surface of the chip body (141) is mounted on the first surface (111) and the connection balls (142) are formed on this mounted surface of the chip body (141). The connection balls (142) of the semiconductor chip (140) are joined to the lands (114) of the multilayered electronic component (110) by using a thermo-compression bonding method with an ultrasonic wave. The connection balls (142) electrically connected to the ground are connected to the heat dissipation pattern (116) through the lands (114). The semiconductor chip (140) is an active device having a plurality of transistors, e.g., FET (Field Effect Transistor), and is exothermic.

Figure 4:
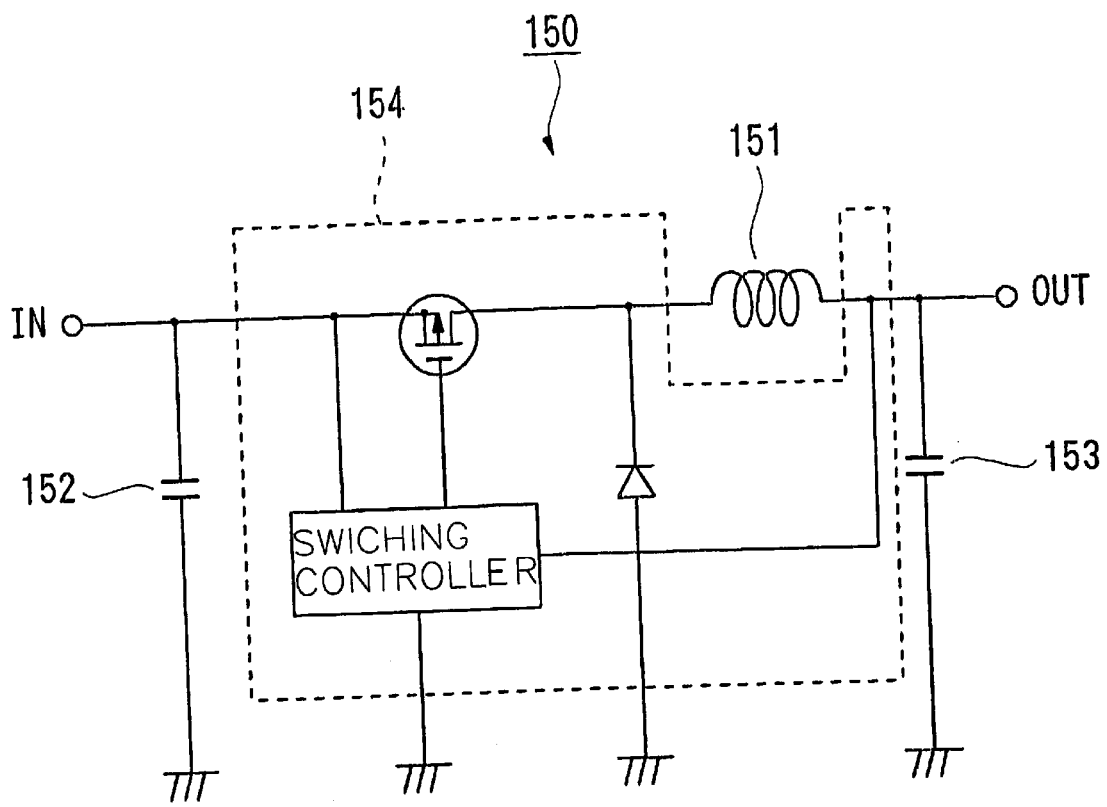
FIG. 4 is a circuit diagram depicting an exemplary electric circuit included in the electronic circuit module shown in FIG. 1.

The electronic circuit module (100) is employed as a function block including the multilayered electronic component (110) and the semiconductor chip (140). The electronic circuit module (100) of this embodiment participates in a complete electric circuit, for example, a switching source circuit (150) commonly disclosed as shown in FIG. 4. The multilayered electronic component (110) of this embodiment corresponds to a choke coil (151) of the switching source circuit (150). Furthermore, the semiconductor chip (140) of this embodiment corresponds to an integrated circuit device (154) except for the choke coil (151) and capacitors (152, 153) of the switching source circuit.

In this embodiment described above, since the multilayered electronic component (110) includes the heat dissipation pattern (116), the heat induced in the semiconductor chip (140) is transferred to the heat dissipation pattern (116). The heat transferred to the heat dissipation pattern (116) is conducted to the circuit board (10) through the external electrode (112). Accordingly, the first embodiment of the present invention can achieve a sufficient thermolytic effect without the formation of the additional radiation components, e.g., heat sink, in the semiconductor chip (140), thereby facilitating the realization of the miniaturization of the electronic circuit module (100).

THE SECOND EMBODIMENT

Description for an electronic circuit module in accordance with the second embodiment of the present invention is followed by accompanying with FIGS. 5 to 8. FIGS. 5 to 8 show a fragmentary perspective view of the electronic circuit module having a partially sectioned multilayered electronic component, a cross sectional view of the electronic circuit module, a cross sectional view explaining the attachment between the electronic circuit module and a circuit board, and a fragmentary perspective view of the multilayered electronic component, respectively.

Differences in the electronic circuit modules between this embodiment and the first embodiment lie in a position of a semiconductor chip and a structure of external electrodes and will be described herebelow.

Figure 5:
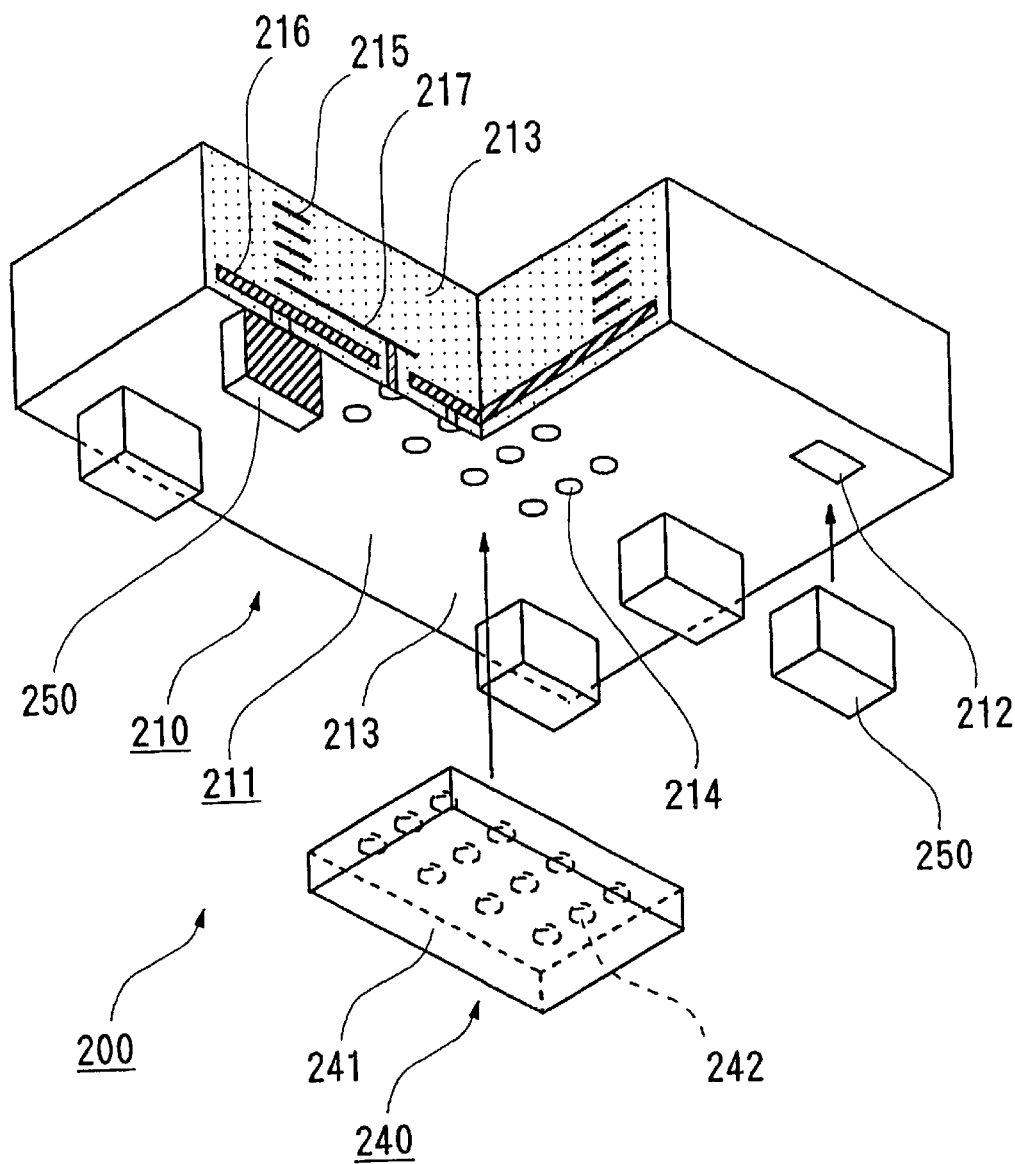
FIG. 5 offers a fragmentary perspective view of an electronic circuit module in accordance with the second embodiment of the present invention, wherein a multilayered electronic component is partially sectioned.

As shown in FIG. 5, an electronic circuit module (200) is provided with a multilayered electronic component (210) having an inductor formed therein, a semiconductor chip (240) and a plurality of metal terminals (250) functioning as external electrodes, wherein the multilayered electronic component (210) is provided with a first surface (211), a second opposite surface and side surfaces, and the semiconductor chip (240) is mounted on the first surface (211) of the multilayered electronic component (210) and the metal terminals (250) are formed on the first surface (211) of the multilayered electronic component (210). Additionally, the multilayered electronic component (210) has a plurality of terminal lands (212) on which the metal terminals (250) are attached by, e.g., soldering, in such a way that each of the terminal lands (212) is connected to one of the metal terminals (250). The electronic circuit module (200) is mounted on a circuit board (10) in such a way that the first surface (211) of the multilayered electronic component (210) faces one surface of the circuit board (10). Each of the metal terminals (250) is electrically connected to an electric circuit pattern (11) formed on the surface of the circuit board (10), as shown in FIGS. 6 and 7.

Figure 6:
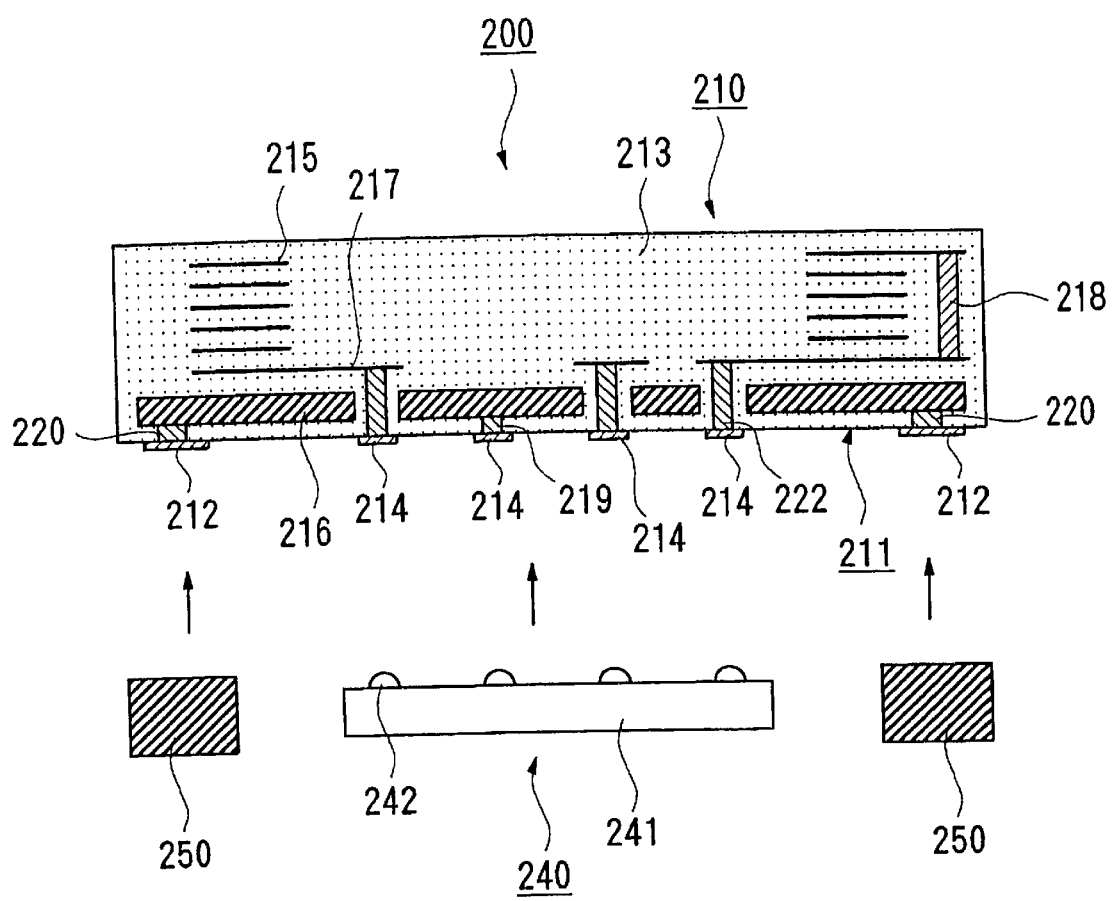
FIG. 6 shows a cross sectional view of the electronic circuit module shown in FIG. 5.
Figure 7:
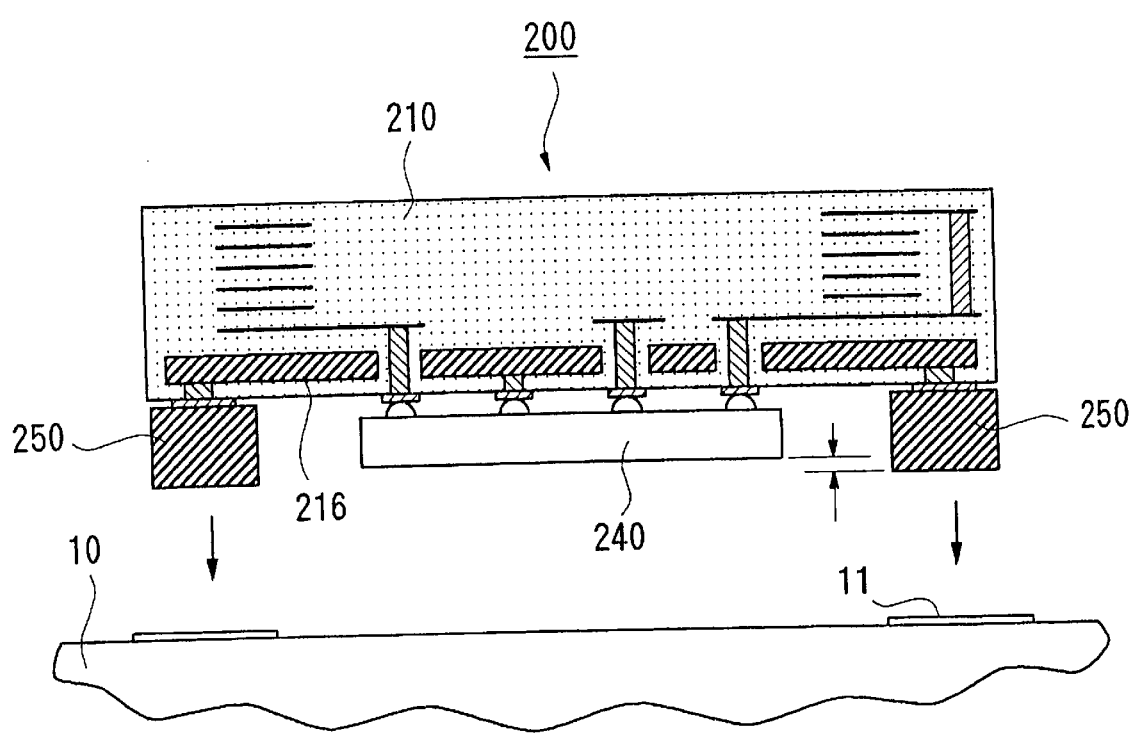
FIG. 7 is a cross sectional view explaining the attachment between the electronic circuit module and a circuit board.

As shown in FIGS. 5 and 6, the multilayered electronic component (210) comprises a sintered magnetic element (213) having an orthorhombic shape, the metal terminals (250) formed on the first surface (211) thereof and having an orthorhombic shape, and a plurality of lands (214) located in the middle of the first surface (211) and functioning as a terminal electrode.

The sintered magnetic element (213) is made of a material having a high permeability, that is, a ferrite. Examples are a Ni—Zn—Cu ferrite, a Ni—Zn ferrite and a Cu—Zn ferrite.

Figure 8:
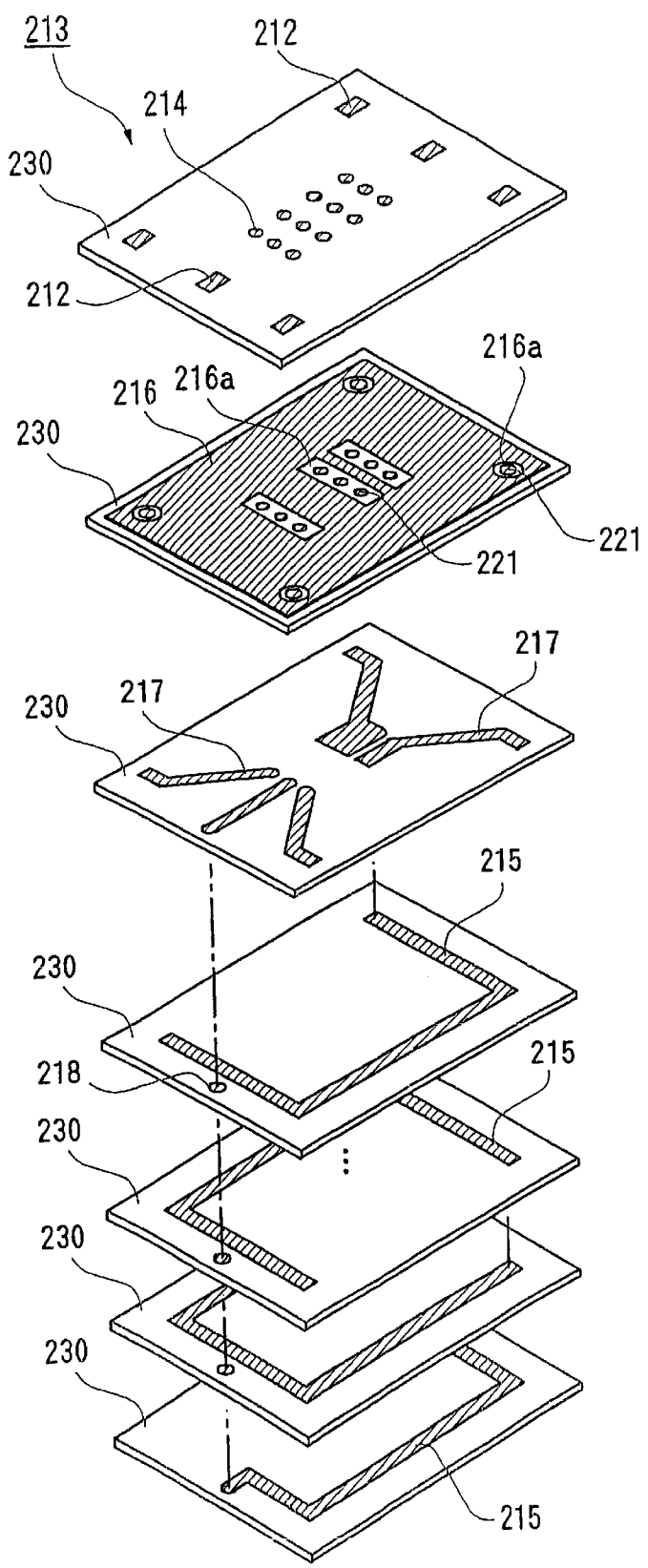
FIG. 8 offers a fragmentary perspective view of the multilayered electronic component shown in FIG. 5.

The sintered magnetic element (213) is formed by piling a plurality of magnetic green sheets (230) up, wherein each of the magnetic green sheets (230) has one of predetermined conductive patterns, as shown in FIG. 8. To be specific, each of the magnetic green sheets (230) includes one pattern selectively chosen from an internal electrode pattern (215) for forming a coil, connection patterns (217), a heat dissipation pattern (216), and the terminal lands (212) together with the lands (214).

Each of the internal electrode patterns (215) is shaped like a horseshoe and pivots on an axis perpendicular to the first surface (211) so as to form a spiral. Each of the internal electrode patterns (215) formed on the magnetic green sheet (230) is electrically connected to another neighboring internal electrode pattern (215) through a via-hole (not shown), in such a way that a wholly connected internal electrode pattern becomes a coil. Both ends of the wholly connected internal electrode pattern (215), that is, an inlet and an outlet of the coil, are electrically connected to the connection patterns (217) through via holes (218). Each of the internal electrode patterns (215) is made from sintering a conductive paste, e.g., Ag-composite.

The heat dissipation pattern (216) is parallel to the first surface (211) and is made of a conductive paste having an efficient thermal conductivity. In this embodiment, the heat dissipation pattern (216) is made from sintering the conductive paste, e.g., Ag-composite, and is thicker than one internal electrode pattern (215) in order to increase the thermal conductivity.

The heat dissipation pattern (216) is connected to the semiconductor chip (240) through the lands (214) and via-holes (219), as shown in FIG. 6, in such a way that heat induced in the semiconductor chip (240) is transferred into the heat dissipation pattern (216). Also, the heat dissipation pattern (216) is connected to the metal terminals (250) through the terminal lands (212) and the via holes (220), in such a way that the heat transferred from the semiconductor chip (240) to the heat dissipation pattern (216) is conducted to the metal terminals (250).

As shown in FIG. 8, the heat dissipation pattern (216) includes a number of empty portions (216a) which are formed in four corners as well as in the middle of the heat dissipation pattern (216). Each of the empty portions (216a) formed in the middle of the heat dissipation pattern (216) has intermediate lands (221) for electrically connecting the land (214) to the connection pattern (217). Also, each of the empty portions (216a) formed in the four corners of the heat dissipation pattern (216) has the intermediate land (221) for electrically connecting the terminal land (212) to the connection pattern (217). Each of the intermediate lands (221) is electrically disconnected from the heat dissipation pattern (216).

In order to efficiently transfer the heat from the semiconductor chip (240) to the heat dissipation pattern (216), it is desirable that a distance between the first surface (211) and the heat dissipation pattern (216) is short. To be specific, it is desirable for the distance to be shorter than the thickness of the heat dissipation pattern (216). In this embodiment, one magnetic green sheet (230) is interposed between the first surface (211) and the heat dissipation pattern (216).

The connection patterns (217) are interposed between the heat dissipation pattern (216) and the internal electrode pattern (215). As shown in FIGS. 6 and 8, one end of each of the connection patterns (217) is electrically connected to one of the lands (214) through a via-hole (222) and the intermediate land (221). Further, the other end of each of the connection patterns (217) is electrically connected to either the terminal land (212) or the internal electrode (215) through either the intermediate land (221) or a via hole, respectively.

As described in the first embodiment, the semiconductor chip (240) of the second embodiment also includes a chip body (241) and a plurality of connection balls (242), wherein one surface of the chip body (241) is mounted on the first surface (211) and the connection balls (242) are formed on this mounted surface of the chip body (241). The connection balls (242) of the semiconductor chip (240) are joined to the lands (214) of the multilayered electronic component (210) by using a thermo-compression bonding method with an ultrasonic wave. The connection balls (242) for electrically connecting the semiconductor chip (240) to the ground are connected to the heat dissipation pattern (216) through the lands (214). The semiconductor chip (240) is an active device having a plurality of transistors, e.g., FET (Field Effect Transistor), and is exothermic.

The metal terminals (250) are joined to the terminal lands (212) of the multilayered electronic component (210) by using, e.g., solder. The metal terminals (250) are of an orthorhombic shape and are made of a material having efficient electrical and thermal conductivity. For example, each of the metal terminals (250) is formed by lead-plating an orthorhombic copper. In the first example of this embodiment, the height of the metal terminals (250) is predetermined to keep apart the semiconductor chip (240) from the circuit board (10) to prevent them from contacting each other when the electronic circuit module (200) is mounted onto the circuit board (10), as shown in FIG. 7.

The electronic circuit module (200) is employed as a function block including the multilayered electronic component (210) and the semiconductor chip (240). Since the electronic circuit module (200) of this embodiment functions similarly to that of the first embodiment in the complete electric circuit, description for the function of the electronic circuit module (200) is omitted.

In the electronic circuit module (200) of this embodiment, since the multilayered electronic component (210) comprises the heat dissipation pattern (216) formed therein, the heat induced in the semiconductor chip (240) is transferred to heat dissipation pattern (216). The heat transferred to the heat dissipation pattern (216) is conducted to the circuit board (10) through the metal terminals (250) and the terminal lands (212). Accordingly, the second embodiment of the present invention can achieve a sufficient thermolytic effect without the formation of the additional radiation components, e.g., heat sink, in the semiconductor chip (240), thereby facilitating the realization of the miniaturization of the electronic circuit module (200).

Figure 9:
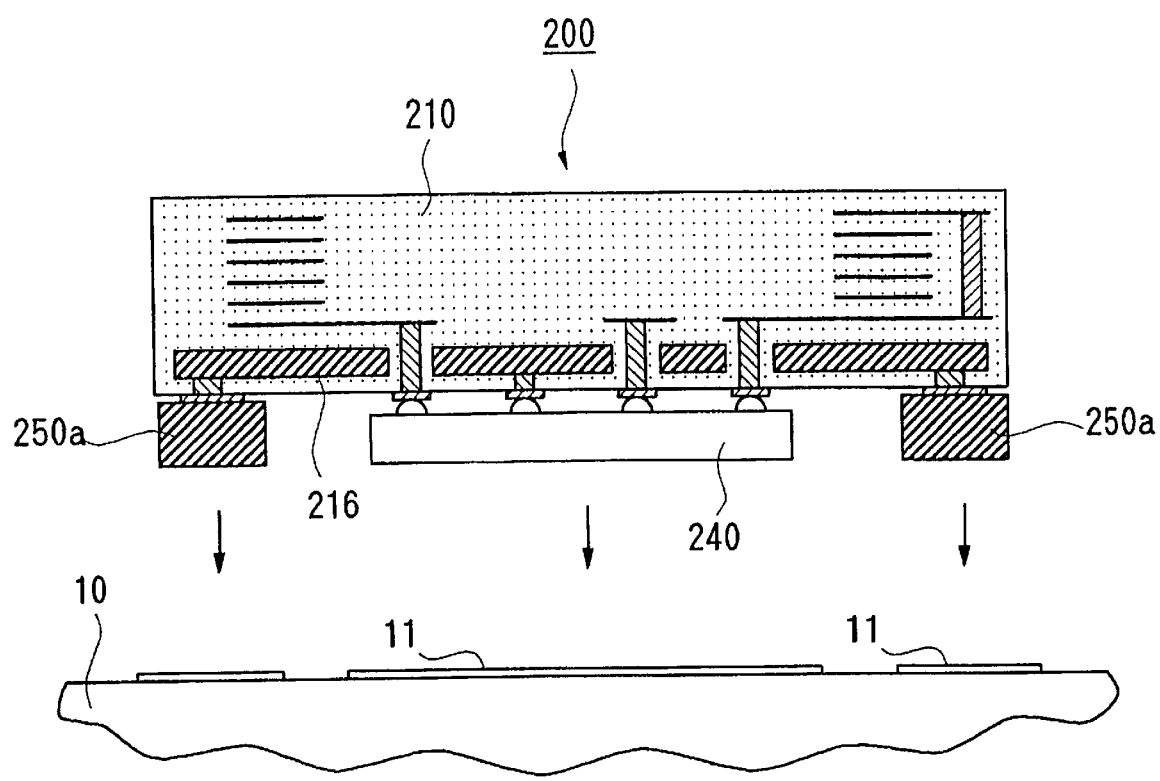
FIG. 9 provides a cross sectional view of the electronic circuit module in accordance with another example of the second embodiment of the present invention.
Figure 10:
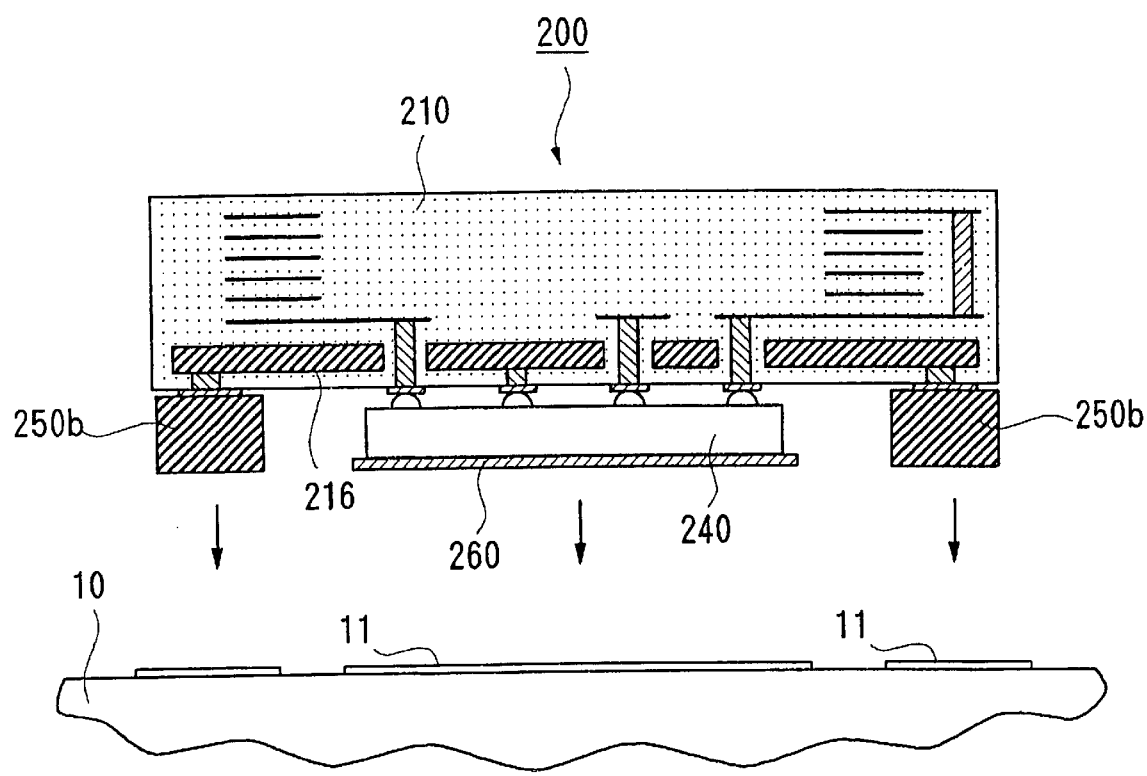
FIG. 10 represents a cross sectional view of the electronic circuit module in accordance with yet another example of the second embodiment of the present invention.

Following descriptions are related to other examples of this embodiment accompanying with FIGS. 9 and 10. FIGS. 9 and 10 provide cross sectional views of the electronic circuit module (200) in accordance with a second and a third example of the second embodiment of the present invention, respectively. Although in the above description the height of the metal terminal (250) has been determined to keep apart the semiconductor chip (240) from the circuit board (10), this embodiment of the present invention is not limited thereto. As shown in FIG. 9, it is possible to make the height of a metal terminal (250a) same as that of the semiconductor chip (240). That is, when the electronic circuit module (200) is mounted onto the circuit board (10), if the electric circuit patterns (11) are formed on one surface of the circuit board (10), the surface of the semiconductor chip (240) facing the circuit board (10) may contact with the electric circuit patterns (11). Accordingly, the heat induced in the semiconductor chip (240) is directly conducted to the circuit board (10), resulting in improving the efficiency of the thermal conduction.

As shown in FIG. 10, if a thermal radiate plate (260) is formed on the surface of the semiconductor chip (240) which faces the circuit board (10) the height of a metal terminal (250b) may be made same as a total combined thickness of the semiconductor chip (240) and the thermal radiate plate (260), wherein it is desirable that a thermal expansion coefficient of the thermal radiate plate (260) is similar to that of the semiconductor chip (240) and the thermal radiate plate (260) has an efficient thermal conductivity. For example, the thermal radiate plate (260) may be formed by gold-coating on a copper foil or an alloy foil composite with 42% of Nickel (Ni) and 58% of Iron (Fe). Desirably, an adhesion material for bonding the thermal radiate plate (260) to the semiconductor chip (240) should be equipped with an efficient thermal conductivity. Additionally, the adhesion material should be desirably equipped with elasticity and a thermal expansion coefficient similar to those of the semiconductor chip (240) as well as the thermal radiation plate (260). An example is a silicon resin paste. The electronic circuit module (200) of the third example of this embodiment may obtain more improved thermolytic effect.

THE THIRD EMBODIMENT

Figure 11:
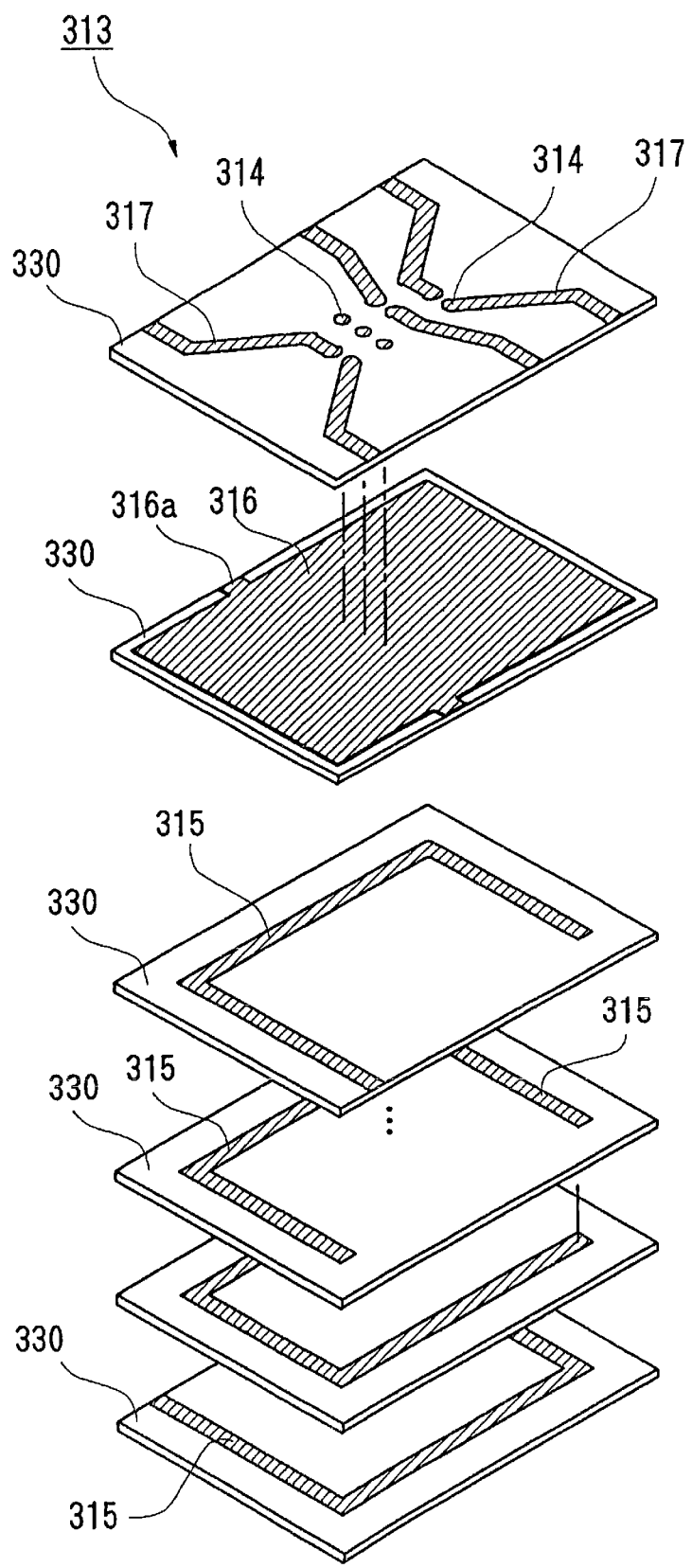
FIG. 11 s hows a fragmentary perspective view of a multilayered electronic component in accordance with the third embodiment of the present invention.

Description for an electronic circuit module in accordance with the third embodiment of the present invention is followed by accompanying with FIG. 11. FIG. 11 shows a fragmentary perspective view of a multilayered electronic component in accordance with the third embodiment of the present invention.

The electronic circuit module of the third embodiment is similar to that of the first embodiment except for a structure of the multilayered electronic component. Accordingly, following description is only concerned with the multilayered electronic component of the third embodiment.

As being similar to the first embodiment, the multilayered electronic component (313) is provided with a first surface, a second opposite surface and side surfaces.

The multilayered electronic component (313) is formed by piling a plurality of magnetic green sheets (330) up, wherein each of the magnetic green sheets (330) has one of predetermined conductive patterns, as shown in FIG. 11. In detail, each of the magnetic green sheets (330) includes one pattern selectively chosen from an internal electrode pattern (315) for forming a coil, a heat dissipation pattern (316), and connection patterns (317) together with lands (314).

As being similar to the first embodiment, each of the internal electrode patterns (315) formed on the magnetic green sheets (330) is shaped like a horseshoe and pivots on an axis perpendicular to the first surface of the multilayered electronic component (313) so as to form a spiral. Each of the internal electrode patterns (315) is electrically connected to another neighboring internal electrode pattern (315) through via-holes (not shown), in such a way that a wholly connected internal electrode pattern (315) becomes a coil. Both ends of the connected internal electrode pattern (315), that is, an inlet and an outlet of the coil, are exposed to the side surfaces of the multilayered electronic component (313) and are positioned so as to overlap with the external electrodes. The internal electrode patterns (315) are made from a sintered conductive paste, e.g., Ag-composite.

As being similar to the first embodiment, the heat dissipation pattern (316) is parallel to the first surface of the multilayered electronic component (313) and is made of a conductive paste having an efficient thermal conductivity. In this embodiment, the heat dissipation pattern (316) is made from sintering the conductive paste, e.g., Ag-composite, and is thicker than one internal electrode pattern (315) in order to increase the thermal conductivity.

As being similar to the first embodiment, the heat dissipation pattern (316) is connected to the semiconductor chip through the lands (314) and via-holes (not shown), in such a way that heat induced in the semiconductor chip is transferred to the heat dissipation pattern (316). The heat dissipation pattern (316) is shaped like a rectangle having a smaller size than that the first surface. The heat dissipation pattern (316) includes portions (316a) extended to the side surface of the multilayered electronic component (313) so as to be electrically connected to the external electrodes, wherein the external electrodes connected to the extended portion (316a) of the heat dissipation pattern (316) is electrically connected to a ground. The heat induced in the semiconductor chip is transferred to the circuit board through the extended portions (316a) of the heat dissipation pattern (316) and the external electrodes, in such a way that the heat will be emitted from the circuit board.

In order to efficiently conduct the heat from the semiconductor chip to the heat dissipation pattern (316), it is desirable that a distance between the heat dissipation pattern (316) and the first surface is short. To be specific, it is desirable for the distance to be shorter than the thickness of the heat dissipation pattern (316). In this embodiment, one magnetic green sheet (330) is interposed between the heat dissipation pattern (316) and the first surface.

The lands (314) and the connection patterns (317) are formed on the first surface of the multilayered electronic component (313). Some of the lands (314) are connected to the heat dissipation pattern (316) through via holes (not shown) and the others are connected to an inward end of a connection pattern (317), wherein each of the connection patterns (317) includes an inward end that overlaps with the others of the lands (314) mentioned above and an opposite outward end that extends to the side surface of the multilayered electronic component (313) so as to overlap with one of the external electrodes.

As described above, the connection patterns (317) of this embodiment are formed on the first surface of the multilayered electronic component (313). On contrast, in the first embodiment, the connection patterns (117) of the multilayered electronic component (110) are positioned close to the internal electrode patterns (115). Accordingly, the heat dissipation pattern (316) provides the electronic circuit module with a shield effect that prevents the noise induced in the wholly connected internal electrode pattern (315), that is, the coil, from interfering with the connection patterns (317). In other words, the heat dissipation pattern (316) functions as a shield interposed between the semiconductor chip and the coil as well as a heat dissipative layer to which the heat induced in the semiconductor chip is rapidly transferred. When the multilayered electronic component (313) is mounted onto the circuit board, the heat dissipation pattern is desirably connected to the ground through the external electrodes to obtain an enhanced shield effect. Other function or effect of this embodiment is same as that of the first embodiment in the present invention.

THE FOURTH EMBODIMENT

Figure 12:
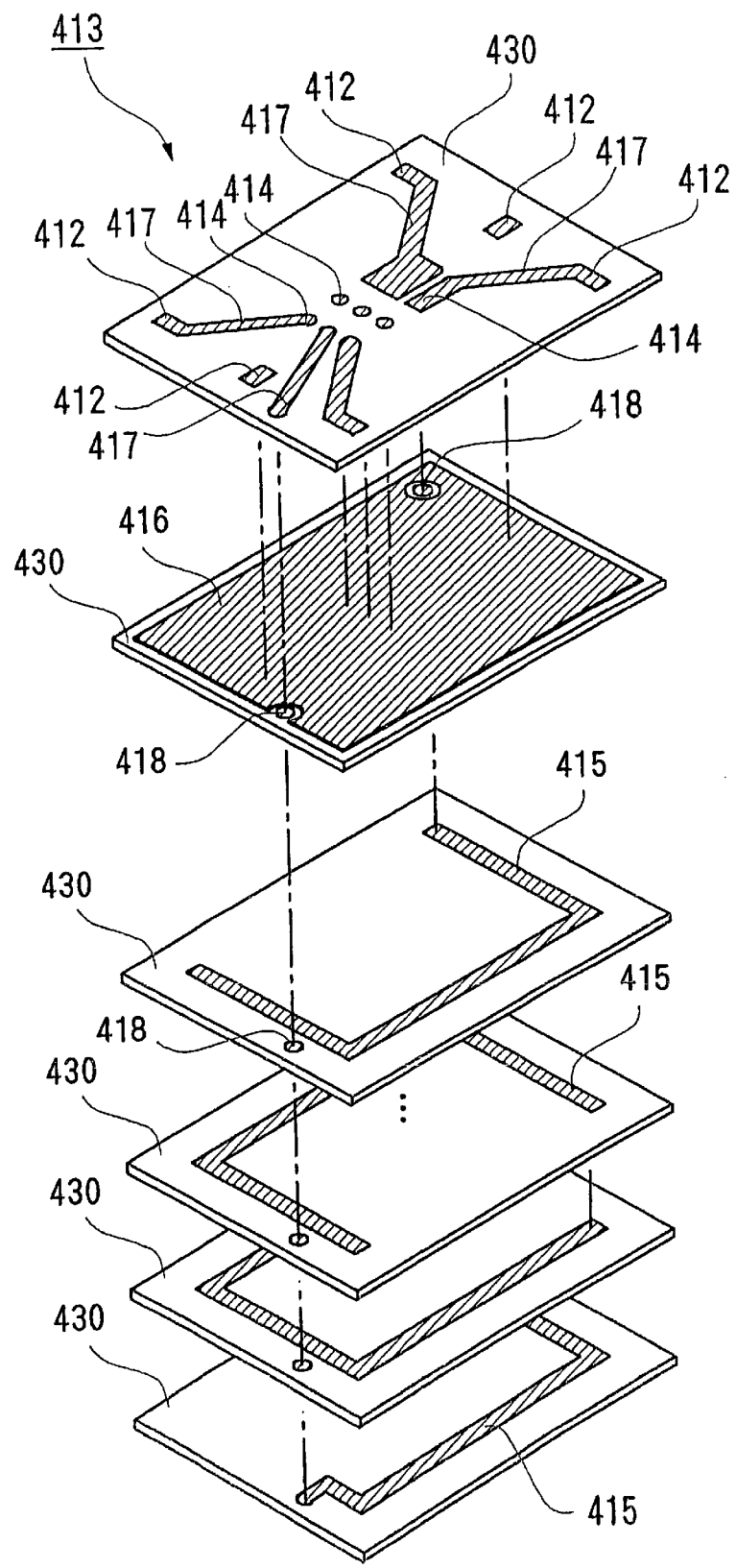
FIG. 12 offers a fragmentary perspective view of a multilayered electronic component in accordance with the fourth embodiment of the present invention.

Following description is concerned with an electronic circuit module in accordance with the fourth embodiment of the present invention accompanying with FIG. 12. FIG. 12 provides a fragmentary perspective view of a multilayered electronic component in accordance with the fourth embodiment of the present invention.

The electronic circuit module of the fourth embodiment is similar to that of the second embodiment except for a structure of the multilayered electronic component. Accordingly, following description is only concerned with the multilayered electronic component of the fourth embodiment.

The multilayered electronic component (413) is provided with a first surface, a second opposite surface and side surfaces, as similar to the second embodiment.

As shown in FIG. 12, the multilayered electronic component (413) is formed by piling a plurality of magnetic green sheets (430) up, wherein each of the magnetic green sheets (430) has one of predetermined conductive patterns. In detail, each of the magnetic green sheets (430) includes one pattern selectively chosen from an internal electrode pattern (415) for forming a coil, a heat dissipation pattern (416), and connection patterns (417), lands (414) and terminal lands (412).

As being similar to the second embodiment, each of the internal electrode patterns (415) is shaped like a horseshoe and pivots on an axis perpendicular to the first surface of the multilayered electronic component (413) so as to form a spiral. Each of the internal electrode patterns (415) formed on the magnetic green sheet (430) is electrically connected to another neighboring internal electrode pattern (415) through a via-hole (not shown), in such a way that a wholly connected internal electrode (415) becomes a coil. Both ends of the wholly connected internal electrode pattern (415), that is, an inlet and an outlet of the coil, are electrically connected to the connection patterns (417) through via holes (418). The internal electrode patterns (415) are made from sintering a conductive paste, e.g., Ag-composite.

The heat dissipation pattern (416) is parallel to the first surface of the multilayered electronic component (413) and is made of a conductive paste having an efficient thermal conductivity. In this embodiment, the heat dissipation pattern (416) is made from sintering the conductive paste, e.g., Ag-composite, and is thicker than one internal electrode pattern (415) to improve the thermal conductivity.

The heat dissipation pattern (416) is connected to a semiconductor chip through the lands (414) and via-holes (not shown), in such a way that the heat induced in the semiconductor chip is transferred to the heat dissipation pattern (416). Also, the heat dissipation pattern (416) is connected to the metal terminals through the terminal lands (412) and via holes (not shown), in such a way that the heat transferred from the semiconductor chip to the heat dissipation pattern (416) is conducted to the metal terminals.

In order to efficiently transfer the heat from the semiconductor chip to the heat dissipation pattern (416), it is desirable that a distance between the first surface of the multilayered electronic pattern (413) and the heat dissipation pattern (416) is short. To be specific, it is desirable for the distance to be shorter than the thickness of the heat dissipation pattern (416). In this embodiment, one magnetic green sheet (430) is interposed between the heat dissipation pattern (416) and the first surface of the multilayered electronic pattern (413).

All of the lands (414), the connection patterns (417) and the terminal lands (412) are formed on the first surface of the multilayered electronic component (413). As described above, some of the lands (414) are connected to the heat dissipation pattern (416) through the via holes (not shown). Each of the connection patterns (417) includes an inward end and an opposite outward end, wherein the inward end of each the connection patterns (417) overlaps with one of the other lands (414) and the opposite outward end of each of the connection patterns (417) overlaps with the terminal lands (412) or is connected to the internal electrode (415) through the via hole (418). The terminal lands (412) are formed on the periphery of the first surface of the multilayered electronic component (413), wherein some terminal lands (412) are connected to the heat dissipation pattern (416), as described above.

AS being similar to the third embodiment, the connection patterns (417) of this embodiment are formed on the first surface of the multilayered electronic component (413). On contrast, in the second embodiment, the connection patterns (217) of the multilayered electronic component (210) are positioned close to the internal electrodes (215). Accordingly, the heat dissipation pattern (416) of this embodiment provides the electronic circuit module with a shield effect that prevents the noise induced in the connected internal electrode patterns (415), that is, the coil, from interfering with the connection patterns (417). In other words, the heat dissipation pattern (416) functions as a shield interposed between the semiconductor chip and the coil as well as a heat dissipative component to which the heat induced in the semiconductor chip is rapidly transferred. When the multilayered electronic component (413) is mounted onto the circuit board, the heat dissipation pattern (416) is desirably connected to the ground through the external electrodes to obtain an enhanced shield effect.

As described above, in the present invention, since the heat dissipation pattern (416) is formed nearby the first surface of the multilayered electronic chip to which the chip will be attached, the heat induced in the chip may be radiated from the heat dissipation pattern (416). Accordingly, in the present invention, the formation of the heat dissipation pattern (416) will make the electronic circuit module be miniaturized as well as have efficient thermolytic effect.

While in the preferred embodiments of the present invention the multilayered electronic component is provided with an inductor, the present invention is not limited thereto. For examples, the multilayered electronic component can be provided with a capacitor or a filer including capacitors and inductors. Additionally, in the above embodiments, the electric circuit having the preferred electronic circuit module is described as the switching circuit but the present invention is not limited thereto.

Although in the above embodiments of the present invention it is described that the heat induced in the semiconductor chip is transferred to the heat dissipation pattern through the via holes and the lands, the present invention is not limited thereto. The heat induced in the semiconductor chip can be conducted to the heat dissipation pattern through the insulation sheet interposed between the thermal radiation pattern and the first surface of the multilayered electronic component.

While in the preferred embodiments of the present invention the heat dissipation pattern is made of the electro-conductive paste, e.g., Ag-composite, other electro-conductive material can be used in their place. Preferably, the heat dissipation pattern may be made from sintering an electro-conductive paste of metal-composite, e.g., Cu-composite or from sintering an electrically insulating and thermal conductive material, e.g., thermal conductive resin.

While, in the exemplary embodiments of the present invention, all of the internal electrodes, the lands and the connection patterns are formed on the identified sheets, i.e., magnetic green sheets, the present invention is not limited thereto. A material for forming the sheet on which the internal electrode patterns will be formed may be determined by a kind of multilayered electronic component. Meanwhile, a material for forming the sheet on which the connection patterns or the lands will be formed can be chosen without regard to their properties, i.e., a magnetic and a dielectric property. In another words, it is possible that the material for forming the internal electrode pattern sheet is different from that for the connection pattern or the land sheets. Preferably, the insulation sheet interposed between the heat dissipation pattern and the first surface of the multilayered electronic component is made of a material having a high thermal conductivity in order to obtain more efficient a thermolytic effect. For example, the insulation sheet is a ceramic sheet mainly composed of alumina.

While the present invention has been shown and described with reference to the particular embodiments, it will be apparent to those skilled in the art that many changes and modifications may be made without departing from the spirit and scope of the invention defined in the appended claims.

What is claimed is:

1. A multilayered electronic component comprising:
    a laminated electronic component provided with a top surface and formed of alternately stacked insulating sheets and conducting patterns;
    a layer of a heat dissipation pattern disposed on the top surface of the laminated electronic component with an insulation layer disposed therebetween; and
    a plurality of lands connected to another electronic component and located on the heat dissipation pattern with another insulation layer disposed therebetween, said another electronic component being connected to the heat dissipation pattern via at least one of the lands and to the laminated electronic component via the remaining lands, wherein heat generated by said another electronic component is transferred to the heat dissipation pattern via said at least one of the lands.

2. The multilayered electronic component of claim 1, wherein said at least one of the lands is electrically connected to the heat dissipation pattern and the thickness of the heat dissipation pattern is greater than that of one of the conducting patterns.

3. The multilayered electronic component of claim 1, further comprising one or more side surfaces and external electrodes, formed on at least one of the side surfaces, for connecting the multilayered electronic component to a circuit board, wherein at least one of the external electrodes is electrically connected to the heat dissipation pattern and the heat transferred to the heat dissipation pattern is transferred to the circuit board through said at least one of the external electrodes.

4. The multilayered electronic component of claim 2, further comprising one or more side surfaces and external electrodes, formed on at least one of the side surfaces, for connecting the multilayered electronic component to a circuit board, wherein at least one of the external electrodes is electrically connected to the heat dissipation pattern and the heat transferred to the heat dissipation pattern is transferred to the circuit board through said at least one of the external electrodes.

5. The electronic circuit module of claim 1, wherein the thickness of the heat dissipation pattern being greater than that of one of the conducting patterns.

6. The multilayered electronic component of claim 1, wherein the thickness of the heat dissipation pattern is greater than the distance between the lands and the heat dissipation pattern.

7. The multilayered electronic component of claim 1, wherein the laminated electronic component is one selected from the group consisting of an inductor, a capacitor and a filter.

8. An electronic circuit module comprising a multilayered electronic component, wherein said multilayered electronic component comprises:

a laminated electronic component provided with a top surface and formed of alternately stacked insulating sheets and conducting patterns;

a layer of a heat dissipation pattern disposed on the top surface of the laminated electronic component with an insulation layer disposed therebetween; and a plurality of lands connected to another electronic component and located on the heat dissipation pattern with another insulation layer disposed therebetween, said another electronic component being connected to the heat dissipation pattern via at least one of the lands and to the laminated electronic component via the remaining lands, wherein heat generated by said another electronic component is transferred to the heat dissipation pattern via said at least one of the lands wherein said another electronic component is mounted on the multilayered electronic component.

9. The electronic circuit module of claim 8, wherein the heat dissipation pattern is electrically connected to a ground.

10. The electronic circuit module of claim 8, wherein said at least one of the lands is electrically connected to the heat dissipation pattern and the thickness of the heat dissipation pattern is greater than that of one of the conducting patterns.

11. The electronic circuit module of claim 10, wherein the heat dissipation pattern is electrically connected to a ground.

12. The electronic circuit module of claim 8, further comprising one or more side surfaces and external electrodes, formed on at least one of the side surfaces, for connecting the multilayered electronic component to a circuit board, wherein at least one of the external electrodes is electrically connected to the heat dissipation pattern and the heat transferred to the heat dissipation pattern is transferred to the circuit board through said at least one of the external electrodes.

13. The electronic circuit module of claim 12, wherein the heat dissipation pattern is electrically connected to a ground.

14. The electronic circuit module of claim 10, further comprising one or more side surfaces and external electrodes, formed on at least one of the side surfaces, for connecting the laminated electronic component to a circuit board, wherein at least one of the external electrodes is electrically connected to the heat dissipation pattern and the heat transferred to the heat dissipation pattern is transferred to the circuit board through said at least one of the external electrodes.

15. The electronic circuit module of claim 14, wherein the heat dissipation pattern is electrically connected to a ground.

16. The multilayered electronic component of claim 8, wherein the thickness of the heat dissipation pattern being greater than that of one of the conducting patterns.

17. The electronic circuit module of claim 8, wherein the thickness of the heat dissipation pattern is greater than the distance between the lands and the heat dissipation pattern.

18. The electronic circuit module of claim 8; wherein the laminated electronic component is one selected from the group consisting of an inductor, a capacitor and a filter.

19. The electronic circuit module of claim 15, wherein the laminated electronic component is one selected from the group consisting of an inductor, a capacitor and a filter.

\* \* \* \* \*